United States Patent [19]
Ito et al.

[11] Patent Number: 5,640,130
[45] Date of Patent: Jun. 17, 1997

[54] ON-OFF CONTROLLED OSCILLATOR WITH CIRCUIT FOR MASKING GLITCHES

[75] Inventors: Masahiro Ito; Fuminori Nagase, both of Hamamatsu, Japan

[73] Assignee: Yamaha Corporation, Hamamatsu, Japan

[21] Appl. No.: 494,839

[22] Filed: Jun. 26, 1995

[30] Foreign Application Priority Data

Jun. 27, 1994 [JP] Japan .................. 6-167435

[51] Int. Cl.$^6$ .................................. H03B 5/32
[52] U.S. Cl. .................. 331/75; 331/158; 331/173; 331/DIG. 3
[58] Field of Search .................... 331/74, 75, 116 R, 331/116 FE, 158, 172, 173, DIG. 3

[56] References Cited

U.S. PATENT DOCUMENTS

| | | | |
|---|---|---|---|
| 4,864,255 | 9/1989 | Yoshida | 331/75 |
| 5,126,695 | 6/1992 | Abe | 331/46 |

FOREIGN PATENT DOCUMENTS

| | | | |
|---|---|---|---|
| 58-165401 | 9/1983 | Japan | 331/74 |
| 6029743 | 4/1994 | Japan . | |

*Primary Examiner*—Siegfried H. Grimm
*Attorney, Agent, or Firm*—Loeb & Loeb LLP

[57] ABSTRACT

An oscillating circuit body 10 includes a first two-input NAND gate, a feedback resistor, a resonator and capacitors. One input terminal of the NAND gate functions as a control terminal to which is applied a first control signal to perform on-off control of oscillation operation of the circuit body. An output terminal of the circuit body is connected to an input terminal of a second two-input NAND gate via two inverters. The other input terminal of the second NAND gate is connected to a control terminal to which a second control signal is applied. The second NAND gate is used for masking the oscillatory output in response to the second control signal for a predetermined period, and the output from the second NAND gate is provided as a final clock output.

17 Claims, 4 Drawing Sheets

ON-OFF CONTROLLED OSCILLATOR WITH CIRCUIT FOR MASKING GLITCHES

BACKGROUND OF THE INVENTION

The present invention relates to an on-off controlled oscillating circuit which is suitable for achieving a power saving function and a clock stop standby function for LSI (large scale integrated circuit).

Oscillating circuits are commonly known which comprise a combination of a quartz oscillator and an amplifier circuit. In some of the oscillating circuits of this type, the oscillation operation is on-off controlled by controlling the output signal from the amplifier circuit. For example, from Japanese Patent Laid-open Publication No. HEI 6-29743, there is known an oscillating circuit which comprises a two-input NAND gate, a quartz oscillator and feedback resistor connected between one input terminal and output terminal of the NAND gate, and resonance capacitors connected to the one input and output terminals, respectively, of the NAND gate and in which the other input terminal of the NAND gate functions as a control terminal.

In the above-mentioned oscillating circuit with a control terminal, when the control signal applied to the control terminal is at a high level, the NAND gate functions as an inverter so that the oscillating circuit operates as a voltage amplifying circuit to provide oscillatory output. Once the control signal turns to a low level, the output of the NAND gate is fixed at a high level to turn OFF or deactivate the oscillation operation. In generating clocks of very low voltage under low supply voltage, a considerable amount of time is required before the oscillation operation is stabilized after the control signal having been switched to the high level to turn ON or activate the oscillating circuit. The disclosure in the above-mentioned Japanese publication is directed to how to reduce the time necessary for the oscillation operation to be stabilized after activation of the oscillating circuit.

However, the prior art on-off controlled oscillating circuits have several inconveniences such as unwanted glitch occurring when the oscillation operation is turned OFF and during a transitional period before the oscillation operation is stabilized after having been turned ON, and unbalanced duty ratio. These inconveniences would unavoidably result in unreliable operation where control is performed to deactivate the oscillating circuit in a certain operational condition and then to again activate the oscillating circuit in that condition for performing power control of LSI or monitoring LSI being processed.

SUMMARY OF THE INVENTION

It is therefore an object of the present invention to provide an oscillating circuit whose oscillating operation can be on-off controlled without causing any unwanted glitch and which achieves stabilization in duty ratio and output voltage level.

In order to accomplish the above-mentioned object, the present invention provides an oscillating circuit which comprises an oscillating circuit body including an oscillator, a controlled-type amplifier circuit, and a control section for performing on-off control of oscillation operation of the circuit body in response to a first control signal, and a gate section provided in an output section of the circuit body for masking an oscillatory output therefrom in response to a second control signal.

The gate section is provided in the output section of the circuit body separately from the control section for performing on-off control of the circuit body so that the oscillatory output is masked and set at a fixed level in response to the second control signal. This gate section masks any glitch occurring at the time of turning ON/OFF of the circuit body based on the first control signal, thus reliably preventing occurrence of any glitch in the final oscillatory output. Further, because the gate section masks the output that is generated after the turning-ON of the oscillating circuit and unstable in duty ratio and level, stable oscillatory output is ensured.

Unless the first and second control signals are generated in synchronism with the oscillatory output, the above-mentioned basic arrangement may still cause glitches in the edges of the first and second control signals depending on the phase relationship of the control signals to the oscillatory output. To obviate such possibility, the oscillating circuit may further comprise a first synchronization circuit section for generating the first control signal in synchronism with the oscillatory output when the oscillation operation of the oscillating circuit body is turned off, and a second synchronization circuit section for generating the second control signal in synchronism with the oscillatory output after the oscillation operation of the oscillating circuit body is turned on.

The oscillating circuit may further comprise a count section arranged to reset its count value when the oscillation operation of the oscillating circuit body is turned off, and then count the oscillatory output after the oscillation operation of the oscillating circuit body is turned on so as to generate a pulse output upon arrival at a predetermined count value, and an automatic generation section for generating the second control signal in such a manner that the oscillatory output is masked upon turning-off of the circuit body and then remains masked after turning-on of the circuit body until the count section generates the pulse output. Enhanced controllability is guaranteed by thus internally automatically generating the second control signal via the counter and synchronization section on the basis of the first control signal.

Further, in a preferred embodiment, the controlled-type amplifier circuit, gate section and first and second synchronization circuit section may be integrally formed in an LSI chip, and the LSI may include a control output terminal for providing, outside the LSI, either the first control signal or a signal obtained by processing the first control signal to have an expanded time width as a control output signal, and a control input terminal for introducing, from outside the LSI, a control input signal to be supplied to the second synchronization circuit section in order to automatically generate the second control signal. With this arrangement, a preferred oscillating circuit is achieved which is carried in the LSI chip. The control output and input terminals provided as the LSI terminals may be interconnected directly. By connecting a separate time-constant delay circuit to the LSI as needed, the masking time during a transitional period of the oscillatory output can be adjusted very easily outside the LSI.

Now, the preferred embodiments of the present invention will be described in detail below with reference to the accompanying drawings.

DETAILED DESCRIPTION OF THE PREFERRED EMBODIMENTS

Figure 1:
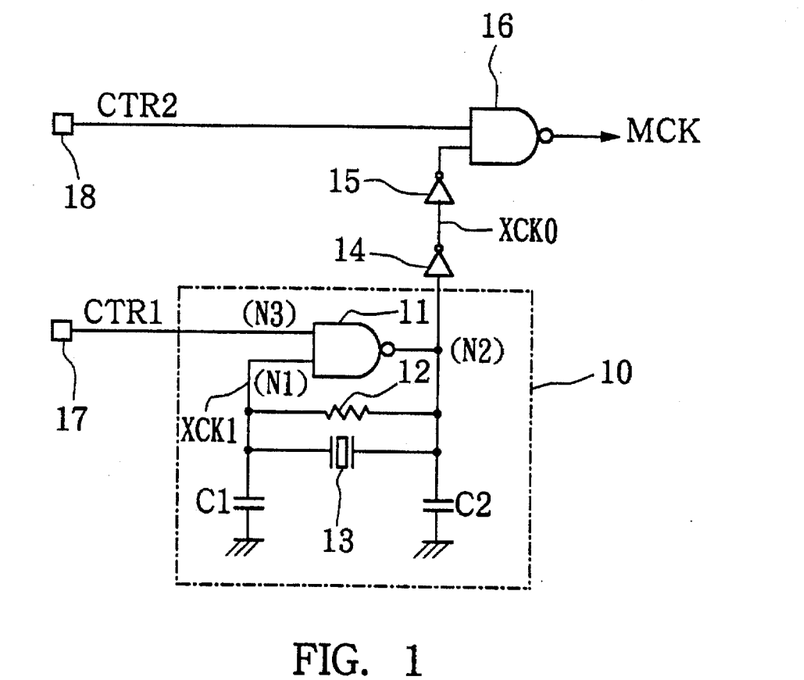
FIG. 1 is a diagram illustrating an oscillating circuit in accordance with a first embodiment of the present invention.

In FIG. 1, there is shown the general arrangement of an oscillating circuit in accordance with a first embodiment of the present invention. The main part or body of the oscillating circuit 10 comprises a first two-input NAND gate 11, a feedback resistor 12 and quartz or ceramic resonator 13 connected between one input terminal N1 and output terminal N2 of the NAND gate 11, capacitors C1 and C2 respectively provided between the one input terminal N1 of the NAND gate 11 and the reference potential and between the output terminal N2 and the reference potential. The other input terminal N3 of the first NAND gate 11 acts as a control terminal 17, through which a first control signal CTR1 is input to perform on-off control of the oscillation operation of the circuit.

The output terminal N2 of the circuit body 10 is connected to one input terminal of a second two-input NAND gate 16 by way of two inverters 14 and 15. The other input terminal of the second NAND 16 is connected to a control terminal 18, through which a second control signal CTR2 is input. This second NAND gate 16 is provided for masking the oscillatory output in response to the second control signal CTR2 for a predetermined time period. The resulting masked oscillatory output is provided as a final clock output MCK.

Figure 2:
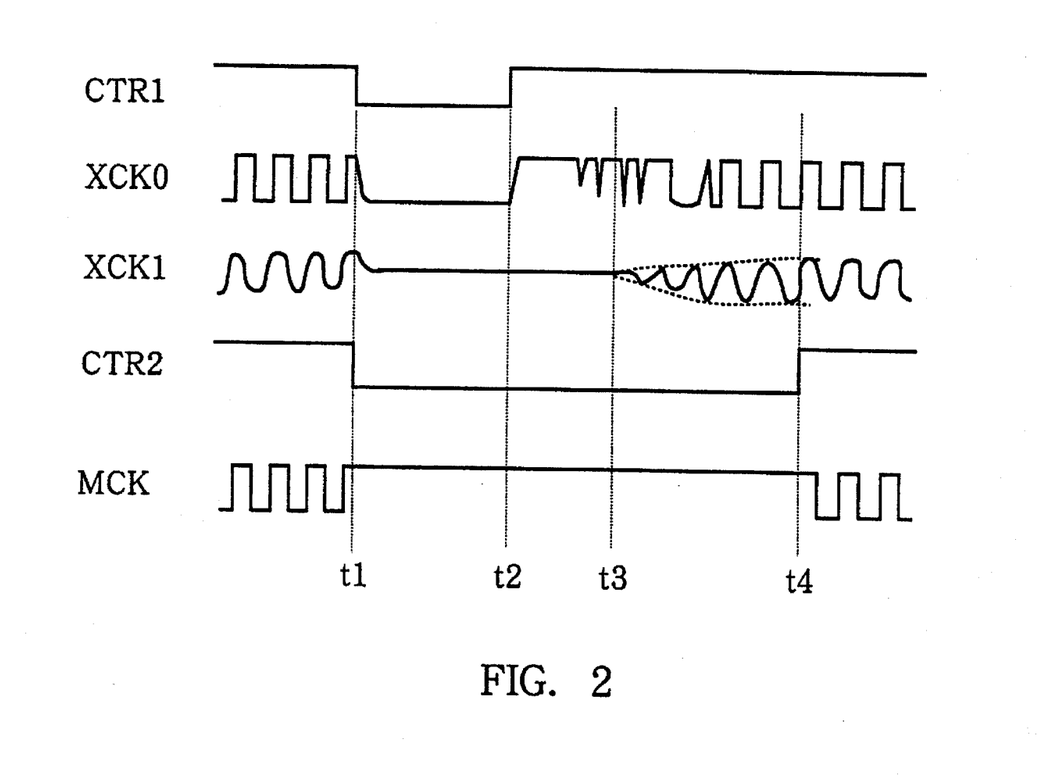
FIG. 2 is a timing chart explanatory of the general operation of the first embodiment.

The general operation of the oscillating circuit according to the first embodiment will be explained below with reference to FIG. 2. When the first control signal CTR1 is at a high level, the first NAND gate 11 acts as an inverter amplifier so as to cause oscillation. FIG. 2 shows waveform changes of various signals occurring when the first control signal CTR1 is switched to a low level at time point t1 to turn off or deactivate the oscillation and then the oscillation operation is turned on or activated again at time point t2. As shown, clock XCK0 resultant from inverting the output of the terminal N2 via the inverter 14 and clock XCK1 obtained at the terminal N1 are in phase with each other when the oscillating circuit is in a steady oscillation state.

After the first control signal CTR1 is changed from the low level to the high level at time point t2 to cause a change from the oscillation-OFF state to the oscillation-ON state, a starting period from t2 to t3 and a subsequent transitional period from t3 to t4 are required before a stable oscillatory output is obtained. The total time required for the output stabilization, which is the sum of the starting and transitional periods, is 10 to 100 ms where a quartz oscillator is employed, or 1 to 5 ms where a ceramic oscillator is employed. However, as seen from the figure, stable level and synchronization of the oscillator output clock XCK1 are not guaranteed in the transitional state, so that there tend to be caused glitches in the oscillation output clock XCK0 and random duty ratio.

To avoid such inconveniences, in this embodiment, the second control signal CTR2 is set to the low level at time point t1 when the first control signal CTR1 is changed to the low level to turn off the oscillation operation, then maintained at the low level for an oscillation-OFF period and the above-mentioned total time period necessary for the output stabilization, and then restored to the high level at time point t4. Throughout these periods, the output of the second NAND gate 16 is fixed at the high level, resulting in masked oscillatory output. After that, stabilized final clock MCK is obtained.

Thus, glitches occurring at the moment when the oscillation operation is turned ON/OFF can also be masked. Output signal unstable in duty ratio and level is also masked, and hence stable oscillatory output can be obtained.

Figure 3:
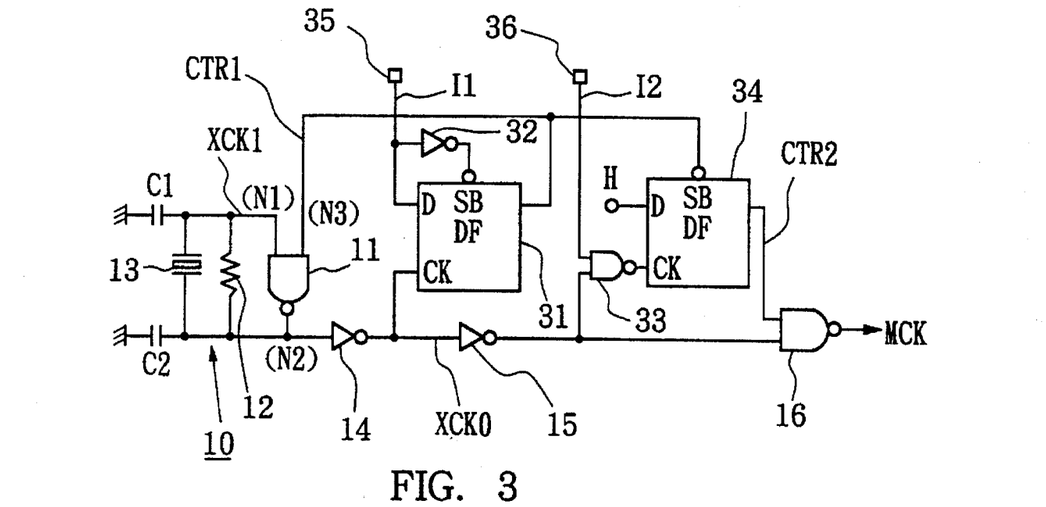
FIG. 3 is a diagram illustrating an oscillating circuit in accordance with a second embodiment of the present invention.

In FIG. 3, there is shown an oscillating circuit in accordance with a second embodiment of the present invention. In FIG. 3, elements and signals corresponding to those in the first embodiment of FIG. 1 are denoted by the same reference characters as in FIG. 1, and they will not be described in detail here to avoid unnecessary duplication. The second embodiment is characterized by the provision of first D and second D flip-flops 31 and 34 as synchronization circuit means for synchronizing first and second control signals CTR1 and CTR2 with oscillating circuit output clock XCK0, respectively.

The first D flip-flop 31 has a clock input terminal to which the oscillating circuit output clock XCK0 is input, and a data input terminal to which control signal I1 is input from a control terminal 35. This control signal I1 is also applied to a reset terminal of the first D flip-flop 31 after having been inverted by an inverter 32. Thus, the flip-flop 31 is constructed as a direct set flip-flop. The output signal of the flip-flop 31 is supplied, as the first control signal CTR1, to the one input terminal of the NAND gate 11 in the body of the oscillating circuit 10.

The second D flip-flop 34 has a clock input terminal, to which is applied an output signal of a NAND gate 33 which is a NAND between an output clock resultant from inverting the oscillating circuit output clock XCK0 via an inverter 15 and control signal I2 supplied from a control terminal 36. The data input terminal of the flip-flop 34 is fixed at the high level (supply voltage), and the first control signal CTR1 is input to the reset terminal of the flip-flop 34. Thus, the flip-flop 34 is constructed as a direct reset flip-flop.

Figure 4:
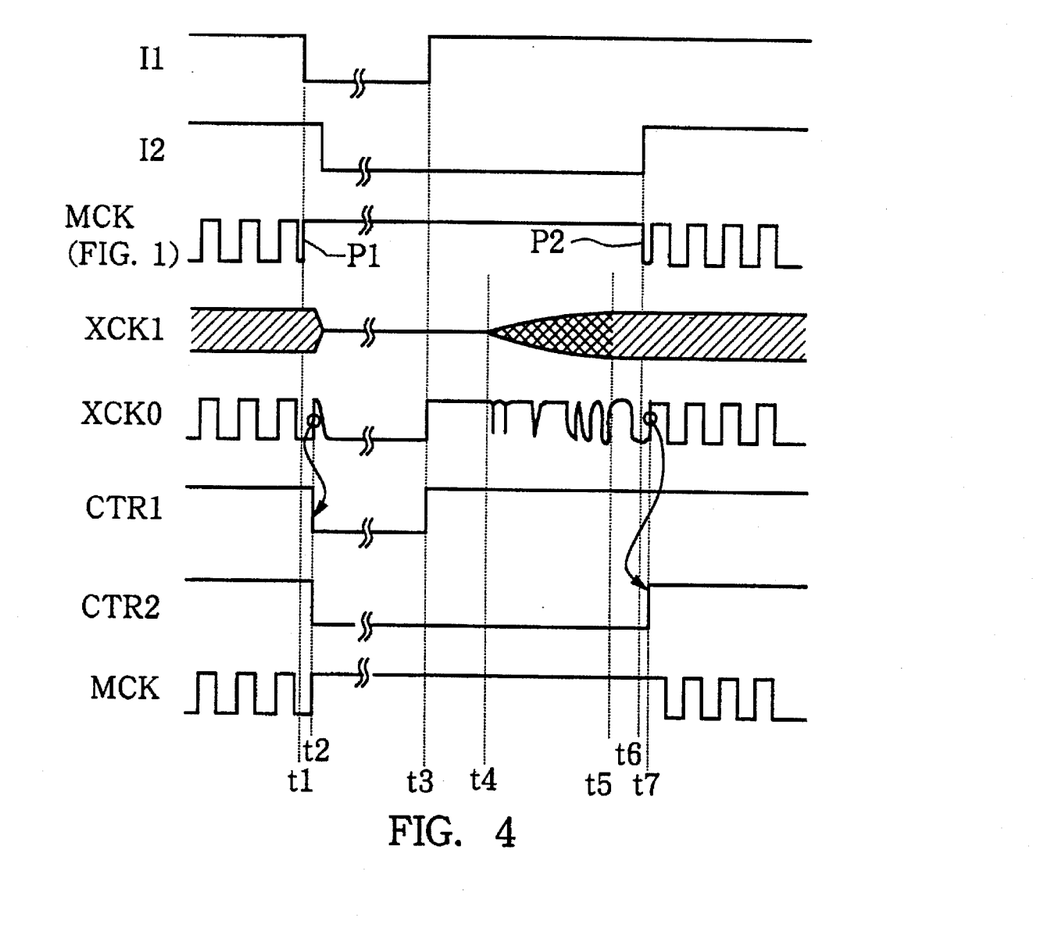
FIG. 4 ia a timing chart explanatory of the general operation of the second embodiment.

The general operation of the oscillating circuit according to the second embodiment will be explained below with reference to the timing chart of FIG. 4. The first embodiment of FIG. 1 does not synchronize the first and second control signals CR1 and CR2 with the output clock and hence can not completely eliminate the possibility of causing glitches. FIG. 4 shows how unwanted glitches are caused in the final oscillatory output clock MCK in the case where the asynchronous control signals I1 and I2 are used directly as the first and second control signals of the first embodiment. Therefore, if the control signal I2 turns to the low level when the final output clock MCK is at the low level, one glitch P1 may occur the moment the oscillation operation is turned OFF as shown. Another glitch P2 may occur the moment the oscillation operation is turned ON.

In view of the foregoing, the second embodiment of FIG. 4 is constructed to reliably obviate occurrence of such glitches in the following manner. Namely, according to the second embodiment, if the control signal I1 is switched to the low level to turn OFF the oscillation operation at time point t1 when the output clock XCK0 is at the low level, the output signal of the first flip-flop 31 turns to the low level at the rising timing (t2) of the output clock XCK0. Namely, while the oscillation operation is OFF, the first control signal CTR1 turns to the low level in synchronism with the rise timing of the output clock XCK0. After that, in response to the first control signal CTR1 turning to the low level, the oscillation operation is deactivated and the final output clock level is fixed, so that occurrence of glitches is prevented when the oscillation operation is turned OFF.

In response to the first control signal CTR1 turning to the low level, the second flip-flop 34 is directly reset. Accordingly, the second control signal CTR2 turns to the low level independently of the timing when the control signal I2 turns to the low level, as shown in FIG. 4.

Once the control signal I1 is switched to the high level at time point t3 so that the first control signal CTR1 turns to the high level to again turn ON the oscillating circuit, a stable oscillatory output is obtained after an starting period from t3 to t4 and the following transitional period from t4 to t5 as mentioned earlier. Then, after the control signal I2 turns to the high level at time point t6, the low level of the output clock XCK0 causes the NAND gate 33 to output a negative pulse which acts as a clock to the second flip-flop 34.

Therefore, as shown in FIG. 4, if the timing when the control signal I2 turns to the high level is within a low-level period of the output clock XCK0, the output of the second flip-flop 34 then turns to the high level at time point t7 when the output level of the clock XCK0 rises. Namely, when the oscillating circuit is turned ON, the second control signal CTR2 rises to the high level in synchronism with the rise timing of the output clock XCK0. In response to the second control signal CTR2 rising to the high level, the masking is released and the final output clock MCK is obtained, so that unwanted glitch is also reliably prevented when the oscillating circuit is turned ON.

In the above-described embodiments, it is necessary that the control of signal for on-off control the body 10 of the oscillating circuit (CTR1 in the example of FIG. 1, or I1 in the example of FIG. 3) and the control signal for masking the oscillatory output for a predetermined period to provide the final output clock MCK (CTR2 in the example of FIG. 1, or I2 in the example of FIG. 3) be generated in another or external circuit. The control signals externally generated are advantageous because they can be suitably used irrespective of the type of the oscillator employed or the capacity of the capacitors.

However, in the above-described embodiments, the control signal CTR2 or I2 for masking the oscillatory output has to be generated for a period sufficient for the oscillatory output to be fully stabilized. Where such control signal generation means is to be implemented by peripheral hardware circuit, the circuit tends to be large in scale and present a safety problem. Where the control signal generation means is to be implemented by microcomputer or software run by a CPU associated with a host computer, there tends to be an increased load on the program such as for timer control.

Figure 5:
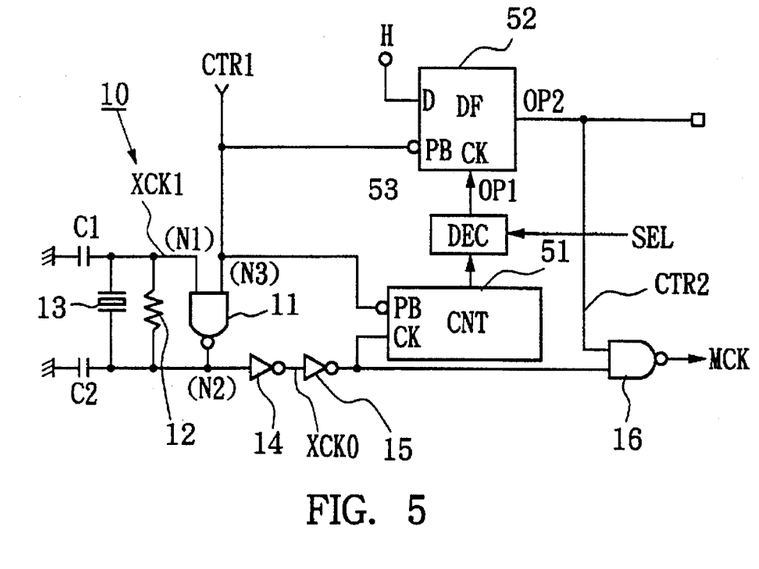
FIG. 5 is a diagram illustrating an oscillating circuit in accordance with a third embodiment of the present invention.

FIG. 5 shows an oscillating circuit in accordance with a third embodiment of the invention, in which the masking control signal is automatically generated internally in the circuit to obviate the foregoing problems. This embodiment is characterized by the provision of a counter 51, a D flip-flop 52 and a decoder 53 in order to internally generate second or masking control signal CTR2 on the basis of the first control signal CTR1 externally supplied for oscillation-OFF control.

The counter 51 is reset in response to the falling edge of the first control signal CTR1 and then proceeds to its counting using, as a clock, the inverted signal of the output clock XCK0 that contains unstableness of the oscillating circuit having been turned ON. The decoder 53 is provided to output a pulse upon arrival at a predetermined count n of the counter 51. In this embodiment, the decoder 53 may be programmed to output any of various decoded values in response to selector signal SEL or to produce a pulse output upon arrival at a predetermined count of the counter 51.

The flip-flop 52 corresponds to the second flip-flop 34 in the second embodiment of FIG. 3, which has a data input terminal fixed at the high level and a reset terminal to which the first control signal CTR1 is applied. The output signal of the decoder 53 is input to the flip-flop 52 as a clock, in response to which the flip-flop 52 generates the second control signal CTR2.

Thus, the counter 51 and decoder 53 together constitute a sort of pulse-width expansion circuit, which functions to delay the rise timing of the second control signal CTR2 generated by the flip-flop 52 on the basis of the first control signal CTR1 by a predetermined time relative to that of the first control signal CTR1.

Figure 6:
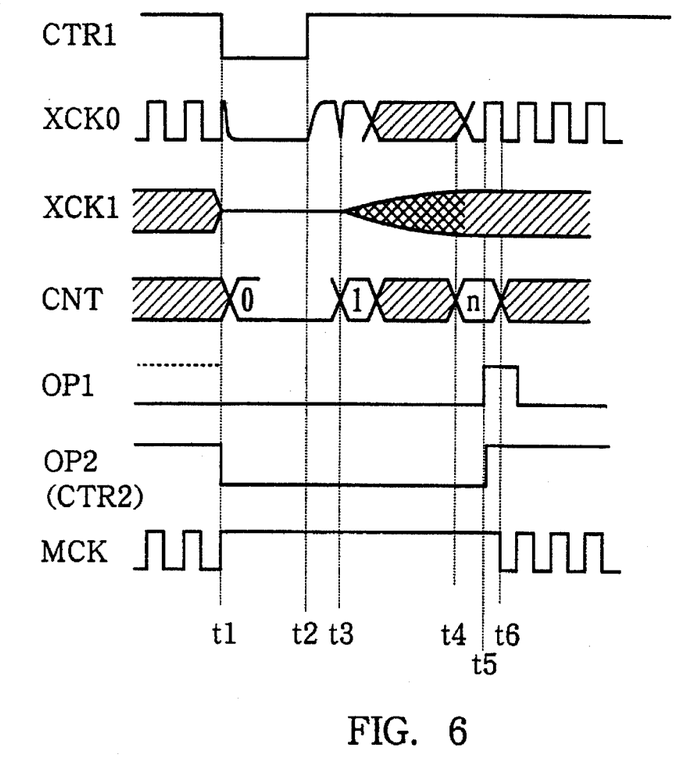
FIG. 6 ia a timing chart explanatory of the general operation of the third embodiment.

FIG. 6 is a timing chart explanatory of the general operation of the third embodiment. At time point t1 when the first control signal CTR1 turns to the low level, the oscillating circuit is turned OFF, as in the other embodiments. At the same time, the flop-flop 52 is reset so that the output signal OP2 of the flip-flop 52, i.e., the second control signal CTR2 declines to the low level, and the counter 51 is also reset. Then, once the first control signal CTR1 rises to the high level at time point t2 to again turn ON the oscillating circuit, the counter 51 proceeds to counting clocks containing unstableness of the oscillating circuit 10.

The decoder 53 is preset to generate an output pulse OP1 when the counter 51 has reached the count value n after a starting period from t2 to t3 and a subsequent transitional period from t3 to t4. The output pulse OP1 generated by the decoder 53 at time point t5 is applied as a clock to the flip-flop 52, so that the flip-flop 52 is reset and its output OP2, i.e., second control signal CTR2 turns to the high level. Consequently, the masking is released so that the final output clock MCK is successively provided starting at time point t6.

According to the third embodiment as described above, the second control signal CTR2 for masking the oscillatory output is automatically generated within the oscillating circuit in such a manner that it declines to the low level in synchronism with the fall of the first control signal CTR1 and then rises in synchronism with the output clock after the number of output clocks generated thereafter has reached a predetermined value. Further, because the pulse-width expansion circuit comprising the counter 51 and decoder 53 is variably controlled by the select signal SEL, it is possible to set the restoration starting period in an optimum manner depending on the oscillatory characteristic of the oscillating circuit. If the oscillating circuit has a specially superior oscillatory characteristic, the necessary restoration period can be substantially reduced without an unnecessarily long masking period.

It is desirable that the number of bits in the counter 51 and the decode value n of the decoder 53 are set optimally depending on the oscillation frequency and starting characteristic (i.e., time required for the output to be stabilized after activation) of the oscillating circuit. In general, the higher the oscillation frequency, the shorter becomes the starting period after the ON-control and the transitional period before the output stabilization. In the starting period, output clock XCK0 sufficient to actuate the counter 51 is not generated, and hence it is not necessary to increase the number of stages in the counter 51 in proportion to the oscillation frequency. Desired results can be achieved by setting the number of stages in the counter 51 and decode value in such a manner as to sufficiently cover a period when the counter 51 is in transitional operation in the neighborhood of a predetermined threshold voltage level.

Figure 7:
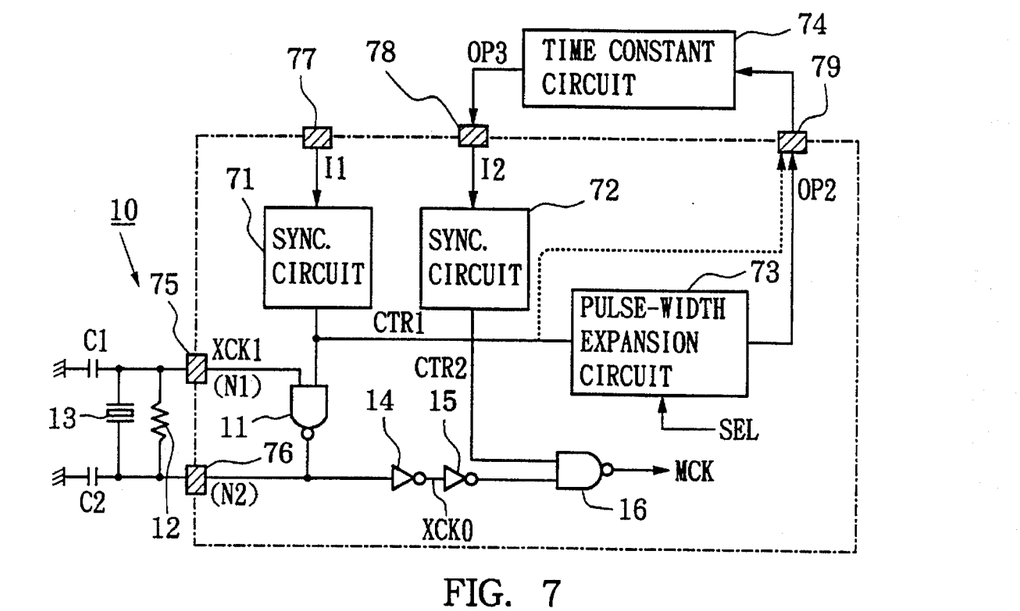
FIG. 7 is a diagram illustrating an oscillating circuit in accordance with a fourth embodiment of the present invention.

FIG. 7 shows the general arrangement of an oscillating circuit in accordance with a fourth embodiment of the invention, in which a part enclosed by a dot-dash line is implemented in an LSI internal circuit. In this embodiment, a feedback resistor 12, a resonator 13 and capacitors C1 and C2 are connected to terminals 75 and 76 of the LSI. Alternatively, the feedback resistor 12 and capacitors C1 and C2 may be provided within the LSI. Within the LSI are also provided other elements of the oscillating circuit such as a first synchronization circuit 71 for synchronously generating first control signal CTR1, a second synchronization circuit 72 for synchronously generating second control signal CTR2, and a pulse-width expansion circuit 73 for delaying the rise timing of the first control signal CTR1.

In the fourth embodiment, the first synchronization circuit 71 corresponds to the D flip-flop 31 and inverter 32 in the second embodiment of FIG. 3, and control signal I1 is supplied via an external control terminal 77 to this circuit 71. Accordingly, after the control signal I1 has turned to the low level, this synchronization circuit 71 generates the first control signal CTR1 that falls in level in synchronism with the rise timing of the output clock, as described earlier in connection with the second embodiment. The second synchronization circuit 72 corresponds to the flip-flop 34 of FIG. 3 or the flip-flop 52 in the third embodiment of FIG. 5 and generates the second control signal CTR2. Further, the pulse-width expansion circuit 73 corresponds to the counter 51, decoder 53 and flip-flop 52 in the third embodiment of FIG. 5.

Control output signal OP2 generated by the pulse-width expansion circuit 73 is taken out through a control output terminal 79 of the LSI. Further, control input signal OP3 to be supplied to the synchronization circuit 72 for generating the second control signal CTR2 (which corresponds to the internal control signal I2 in the embodiment of FIG. 3) is introduced through a control input terminal 78. In FIG. 7, a time constant circuit 74 is connected to the LSI between the control output and input terminals 79 and 78.

The time constant circuit 74 functions to delay the control output signal OP2 taken out from the pulse-width expansion circuit 73 by a predetermined time and supplies the thus-delayed signal to the control input terminal 78 as the control input signal OP3. The time constant circuit 74 may for example be in the form of a simple delay circuit composed of a resistor and a condenser, or a one-shot multivibrator.

In an alternative arrangement, the first control signal CTR1 may be directly taken out as the control output signal OP2 without providing the pulse-width expansion circuit 73 within the LSI.

To connect the time constant circuit 74 to the LSI is just one form of implementation, and the control input signal OP3 introduced through the control input terminal 78 may be generated by another circuit as in the embodiment of FIG. 3. Alternatively, the control output terminal 79 may be directly coupled with the control input terminal 78 so that the control output signal OP2 from the pulse-width expansion circuit 73 is directly supplied to the terminal 78 as the control input signal OP3 so as to generate the second control signal CTR2.

Figure 8:
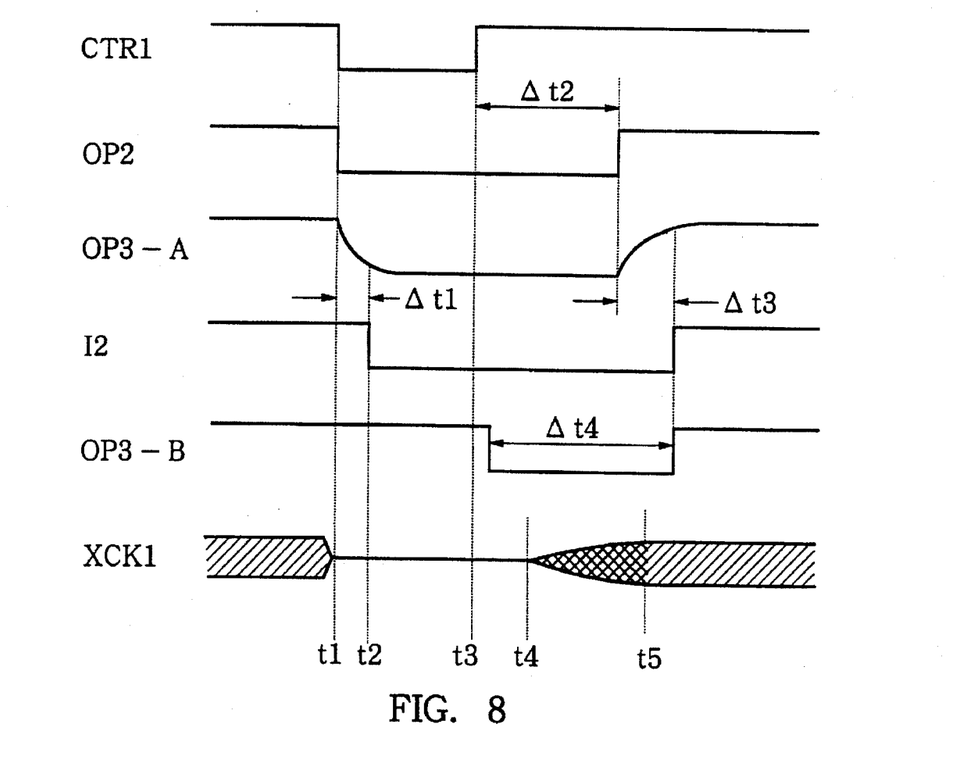
FIG. 8 ia a timing chart explanatory of the general operation of the fourth embodiment.

FIG. 8 shows a timing chart explanatory of the general operation of the embodiment of FIG. 7 where the time constant circuit 74 is connected to the LSI. In a similar manner to the other embodiments, the first control signal CTR1 is generated by the first synchronization circuit 71 on the basis of the internal control signal I1, and the pulse-width expansion circuit 73, on the basis of the first control signal CTR1, generates the control output signal OP2 having a pulse width increased by $\Delta$ t2. In the case where the time constant circuit 74 is a simple delay circuit, as the result of the control output signal OP2 taken out at the control output terminal 79 passing through the time constant circuit 74, there is obtained the control input signal OP3-A whose rising and falling edges have been made gentler as shown in FIG. 8.

If the control input terminal 78 has a Schmidt trigger function, internal control signal I2 is obtained, from the control input signal OP3-A, whose rise and fall timing is delayed by $\Delta$ t1 and $\Delta$ t3, respectively, from that of the control output signal OP2. On the basis of this internal control signal I2, the second synchronization circuit 72 generates the second control signal CTR2 for masking the output. Therefore, a stable oscillatory output can be obtained if the low-level period of the internal control signal I2 is long enough to cover a time zone lasting from oscillation-deactivating timing t1, through a starting period from t3 to t4 after reactivation of the oscillating circuit, up to an output stabilization period from t4 to t5.

In such a case where the time constant circuit 74 comprises a one-shot multivibrator and the first control signal CTR1 is taken out and applied to the time constant circuit 74, it is possible to obtain control input signal OP3-B having a width $\Delta$ t4 in synchronism with the fall timing of the first control signal CTR1. Also in this case, selection of the time width $\Delta$ t4 allows a stable output to be obtained by masking the unstable output.

According to the fourth embodiment as described above, the masking control signal CTR2 can be automatically generated by providing the pulse-width expansion circuit 73 internally within the LSI and directly coupling the controlling terminal 79 with the control input terminal 78. In the event that sufficient time for masking the oscillatory output can not be secured due to shortage of the counter stages in the pulse-width expansion circuit 73 or the like, necessary masking time can be provided by connecting a simple time constant circuit 74 to the LSI.

Further, where no pulse-width expansion circuit 73 is provided and the first control signal CTR1 is taken out directly, it is sometimes probable that the necessary masking time is not provided by merely delaying the signal CTR1 and introducing it through the control input terminal 78. In such a case, it is allowed to automatically generate second control signal CTR2 having a necessary pulse width by use of one-shot multivibrator as the time constant circuit 74.

As has been described so far, the present invention is characterized in that the gate means for selectively controlling the takeout of oscillatory output is provided in the output section separately from the control means for performing on-off control of the oscillator's oscillation, and this feature reliably prevents the final output from being adversely effected by glitches that may occur at the time of deactivation of the oscillating circuit body and during the unstable output period after activation of the oscillating circuit, thus achieving a final oscillatory output stable in level and duty ratio.

What is claimed is:

1. An oscillating circuit comprising:
   an oscillating circuit body including a resonator, a controlled-type amplifier circuit, and control means for performing on-off control of oscillation operation of said circuit body in response to a first control signal;
   gate means provided in an output section of said circuit body, for masking an oscillatory output therefrom in response to a second control signal:
   first synchronization circuit means for generating said first control signal in synchronism with the oscillatory output when the oscillation operation of said oscillating circuit body is turned off; and
   second synchronization circuit means for generating said second control signal in synchronism with the oscillatory output after the oscillation operation of said oscillating circuit body is turned on.

2. An oscillating circuit comprising:
   an oscillating circuit body including a resonator, a controlled-type amplifier circuit, and control means for performing on-off control of oscillation operation of said circuit body in response to a first control signal;
   gate means provided in an output section of said circuit body, for masking an oscillatory output therefrom in response to a second control signal;
   count means for resetting a count value thereof when the oscillation operation of said oscillating circuit body is turned off, and then counting the oscillatory output after the oscillation operation of said oscillating circuit body is turned on so as to generate a pulse output upon reaching a predetermined, user settable count value; and
   automatic generation means for generating said second control signal such that the oscillatory output is masked when said oscillating circuit body is turned off and then remains masked until said count means generates the pulse output.

3. An oscillating circuit as defined in claim 1, wherein said controlled-type amplifier circuit, gate means and first and second synchronization circuit means are integrally formed in an LSI chip, and wherein said LSI chip includes a control output terminal for providing, outside said LSI chip, either said first control signal or a signal obtained by processing said first control signal to have an expanded time width as a control output signal, and a control input terminal for introducing, from outside said LSI chip, a control input signal to be supplied to said second synchronization circuit means in order to automatically generate said second control signal.

4. An oscillating circuit as defined in claim 3, wherein a time-constant delay circuit is provided outside said LSI chip and connected between said control output terminal and said control input terminal, for generating said control input signal on the basis of said control output signal.

5. An oscillating circuit comprising:
   an oscillating circuit body including a resonator, a controlled-type amplifier circuit, and a control circuit that performs on-off control of oscillation operation of the oscillating circuit body in response to a first control signal;
   a gate circuit, provided in an output section of the oscillating circuit body, that masks an oscillatory output therefrom in response to a second control signal;
   a first synchronization circuit that generates the first control signal in synchronism with the oscillatory output when the oscillation operation of the oscillating circuit body is turned off; and
   a second synchronization circuit that generates the second control signal in synchronism with the oscillatory output after the oscillation operation of the oscillating circuit body is turned on.

6. An oscillating circuit as defined in claim 5, wherein the controlled-type amplifier circuit, gate circuit and first and second synchronization circuits are integrally formed in an LSI chip, and wherein the LSI chip includes:
   a control output terminal that provides, outside the LSI chip, either the first control signal or a signal obtained by processing the first control signal to have an expanded time width as a control output signal; and
   a control input terminal that introduces, from outside the LSI chip, a control input signal to be supplied to the second synchronization circuit in order to automatically generate the second control signal.

7. An oscillating circuit as defined in claim 6, wherein a time-constant delay circuit, which generates the control input signal on the basis of the control output signal, is provided outside the LSI chip and connected between the control output terminal and the control input terminal.

8. An oscillating circuit comprising:
   an oscillating circuit body including a resonator, a controlled-type amplifier circuit, and a control circuit that performs on-off control of oscillation operation of the oscillating circuit body in response to a first control signal;
   a gate circuit, provided in an output section of the oscillating circuit body, that masks an oscillatory output therefrom in response to a second control signal;
   a counting circuit that resets a count value thereof when the oscillation operation of the oscillating circuit body is turned off, and then counts the oscillatory output after the oscillation operation of the oscillating circuit body is turned on so as to generate a pulse output upon reaching a predetermined, user settable count value; and
   an automatic generation circuit that generates the second control signal such that the oscillatory output is masked when the oscillating circuit body is turned off and then remains masked until the counting circuit generates the pulse output.

9. An oscillating circuit as defined in claim 8, wherein a counter and a decoder are used to set the predetermined, user settable count value to optimize and control a masking period for the oscillatory output.

10. An oscillating circuit as defined in claim 5, wherein the first synchronization circuit includes:
    a first inverter gate having an input connected to receive the oscillatory output;
    a second inverter gate having an input connected to an output of the first inverter gate;
    a third inverter gate having an input connected to an ON-OFF signal; and
    a flip-flop having a clock input connected to the output of the first inverter gate, a reset input connected to an output of the third inverter gate, a data input connected to the ON-OFF signal, and a data output producing the first control signal, wherein the second synchronization circuit includes:
    a NAND gate having a first input connected to an output of the second inverter gate of the first synchronization circuit, and a second input connected to a masking period signal; and a flip-flop having a clock input connected to an output of the NAND gate, a data input connected to a high level signal, a reset input connected to the first control signal, and a data output producing the second control signal.

11. An oscillating circuit as defined in claim 8, wherein the counting circuit includes:

a counter having a reset input connected to the first control signal, and a clock input connected to the oscillatory output; and a decoder having an input connected to an output of the counter, and a select input connected to a select signal, wherein the automatic generation circuit that generates the second control signal includes:

a flip-flop having a clock input connected to an output of the decoder, a reset input connected to the first control signal, a data input connected to a high level signal, and a data output producing the second control signal.

12. An oscillating circuit as defined in claim 6, including:

the first synchronization circuit having an input connected to an external control terminal, and an output producing the first control signal;

the second synchronization circuit having an input connected to the control input terminal, and an output producing the second control signal.

13. An oscillating circuit as defined in claim 12, further including:

a pulse-width expansion circuit having an input connected to the output of the first synchronization circuit, a select input connected to a select signal, and an output connected to the control output terminal.

14. An oscillating circuit as defined in claim 13, further including:

a time-constant delay circuit having an input connected to the control output terminal, and an output connected to the control input terminal.

15. A method of masking glitches in an oscillating signal, the method comprising the steps of:

performing an on-off control of an oscillation operation in response to a first control signal;

masking an oscillatory output in response to a second control signal;

generating the first control signal in synchronism with the oscillatory output when the oscillation operation is turned off; and generating the second control signal in synchronism with the oscillatory output after the oscillation operation is turned on.

16. A method as defined in claim 15, which further comprises:

providing either the first control signal or a signal obtained by processing the first control signal to have an expanded time width as a control output signal;

generating automatically the second control signal by processing a control input signal.

17. A method as defined in claim 16, which further comprises:

generating the control input signal on the basis of the control output signal by using a time-constant circuit connected between the control output terminal and the control input terminal.

* * * * *